United States Patent
Sharma et al.

(10) Patent No.: US 12,355,433 B2
(45) Date of Patent: Jul. 8, 2025

(54) POWER ON RESET (POR) CIRCUIT

(71) Applicant: NXP B.V., Eindhoven (NL)

(72) Inventors: Sapna Sharma, Bangalore (IN);
Sanjay Kumar Wadhwa, Noida (IN);
Neha Goel, Noida (IN)

(73) Assignee: NXP B.V., Eindhoven (NL)

( * ) Notice: Subject to any disclaimer, the term of this patent is extended or adjusted under 35 U.S.C. 154(b) by 82 days.

(21) Appl. No.: 18/311,696

(22) Filed: May 3, 2023

(65) Prior Publication Data
US 2024/0305289 A1 Sep. 12, 2024

(30) Foreign Application Priority Data
Mar. 8, 2023 (IN) .............................. 202341015473

(51) Int. Cl.
*H03K 17/22* (2006.01)
*H03K 3/037* (2006.01)
*H03K 17/284* (2006.01)

(52) U.S. Cl.
CPC ......... *H03K 17/223* (2013.01); *H03K 3/0377* (2013.01); *H03K 17/284* (2013.01)

(58) Field of Classification Search
CPC ... H03K 17/223; H03K 3/0377; H03K 17/284
See application file for complete search history.

(56) References Cited

U.S. PATENT DOCUMENTS

| | | | |
|---|---|---|---|
| 6,181,173 B1 | 1/2001 | Homol et al. | |
| 7,161,396 B1 * | 1/2007 | Zhou | H03K 17/223 327/143 |
| 7,372,289 B2 * | 5/2008 | Hirooka | H03K 17/223 324/764.01 |
| 9,654,096 B1 | 5/2017 | Wadhwa et al. | |
| 2018/0183419 A1 * | 6/2018 | Arbetter | H03K 3/02337 |

OTHER PUBLICATIONS

Ay, Suat U.; "A Nanowatt Cascadable Delay Element for Compact Power-on-Reset (POR) Circuits"; 2009 52nd IEEE International Midwest Symposium on Circuits and Systems; Aug. 2009; 4 pages.

* cited by examiner

*Primary Examiner* — Metasebia T Retebo

(57) ABSTRACT

One example discloses a power on reset (POR) circuit, including: an input configured to receive a power supply voltage; a delay circuit configured to output a first signal to a set of logic circuits prior to a delay time; wherein the delay circuit is configured to output a second signal to the set of logic circuits after the delay time; wherein the delay circuit includes a voltage drop device coupled to receive the power supply voltage, a switching device having an on-resistance and coupled to the voltage drop device, and a capacitance device having a capacitance and coupled to the switching device; and wherein the on-resistance of the switching device and the capacitance of the capacitance device together are configured to set the delay time.

18 Claims, 5 Drawing Sheets

POWER ON RESET (POR) CIRCUIT

CROSS-REFERENCE TO RELATED APPLICATIONS

This application claims the priority under 35 U.S.C. § 119 of Indian Patent Application number 202341015473, filed on 8 Mar. 2023, the contents of which are incorporated by reference herein.

BACKGROUND

The present specification relates to systems, methods, apparatuses, devices, articles of manufacture and instructions for power on reset (POR) circuits.

SUMMARY

According to an example embodiment, a power on reset (POR) circuit, comprising: an input configured to receive a power supply voltage; a delay circuit configured to output a first signal to a set of logic circuits prior to a delay time; wherein the delay circuit is configured to output a second signal to the set of logic circuits after the delay time; wherein the delay circuit includes a voltage drop device coupled to receive the power supply voltage, a switching device having an on-resistance and coupled to the voltage drop device, and a capacitance device having a capacitance and coupled to the switching device; and wherein the on-resistance of the switching device and the capacitance of the capacitance device together are configured to set the delay time.

In another example embodiment, the voltage drop device is configured to reduce a voltage received by the switching device.

In another example embodiment, the reduced voltage received by the switching device causes the on-resistance of the switching device to increase.

In another example embodiment, the switching element is a MOSFET.

In another example embodiment, the voltage drop device is a resistor.

In another example embodiment, the voltage drop device is a diode.

In another example embodiment, the voltage drop device is a diode connected PMOS device.

In another example embodiment, the delay circuit is configured to output the first signal when the power supply voltage is below a predetermined voltage.

In another example embodiment, the delay circuit is configured to output the second signal when the power supply voltage is above the predetermined voltage.

In another example embodiment, the predetermined voltage is a POR de-assertion threshold voltage.

In another example embodiment, the delay time starts when the POR circuit receives the power supply voltage.

In another example embodiment, further comprising a hysteresis device, having an input and an output, coupled between the delay circuit and the set of logic circuits.

In another example embodiment, the input of the hysteresis device is configured to receive a ramping voltage from the delay circuit.

In another example embodiment, the hysteresis device is configured to transmit the first signal on the output when the ramping voltage is below the predetermined voltage; and the hysteresis device is configured to transmit the second signal on the output when the ramping voltage is above the predetermined voltage.

In another example embodiment, the hysteresis device is a Schmitt trigger circuit.

In another example embodiment, further comprising a pull-up transistor coupled to receive the power supply voltage and the output of the hysteresis device.

In another example embodiment, the capacitance device coupled to a ground.

In another example embodiment, the set of logic circuits include at least one of: a state device, a latch, a set-reset, a flip-flop, a controller, a computational circuit, or another logic device.

In another example embodiment, the POR circuit consumes nearly zero current.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
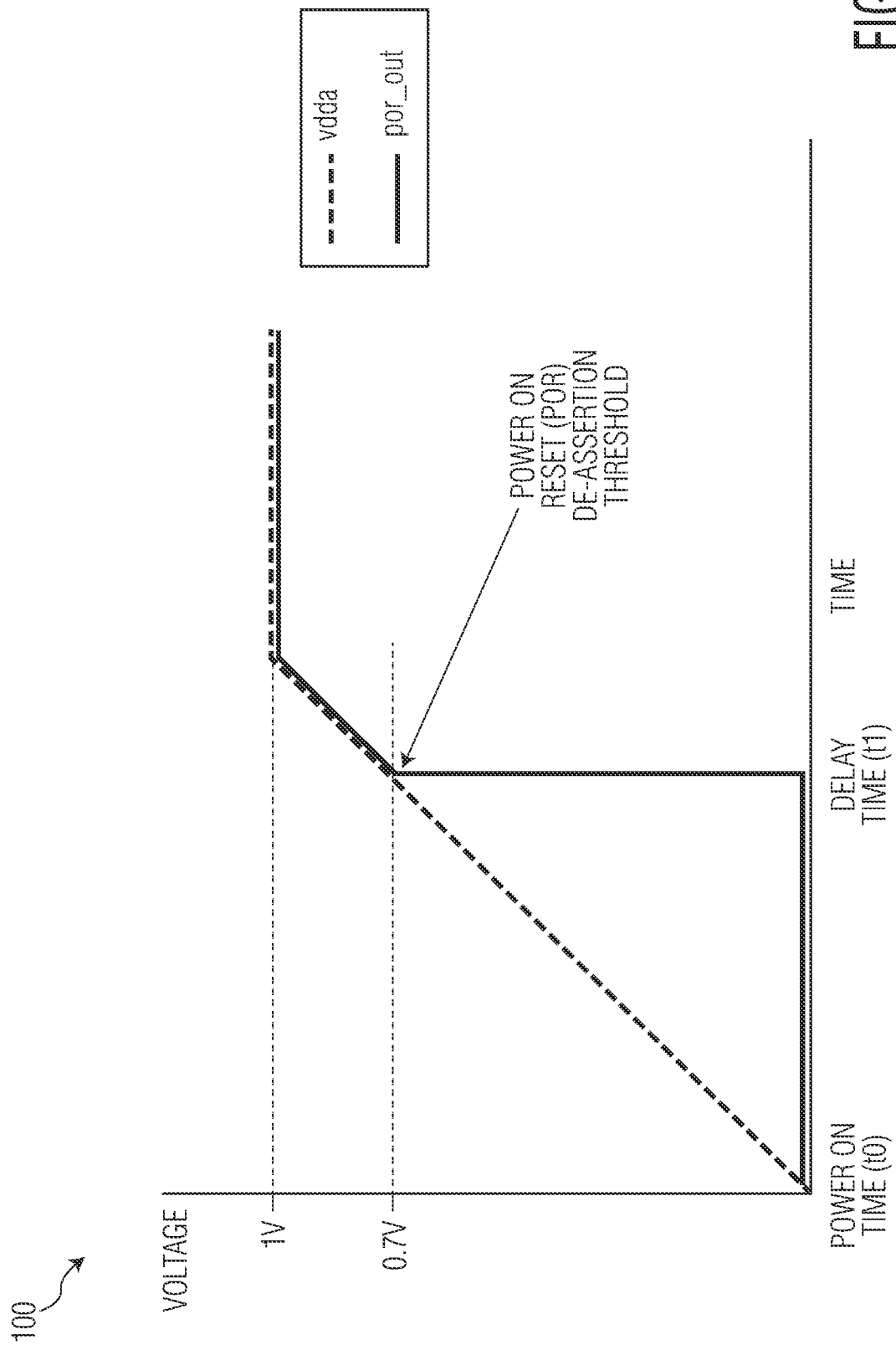
FIG. 1 represents an example graph of a delay-based power on reset (POR) function.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION OF EMBODIMENTS

FIG. 1 represents an example graph 100 of a delay-based power on reset (POR) function. Power on reset (POR) circuits are used to keep sequential (e.g. logic) elements/circuits such as flip-flop, set-reset, etc. circuits in a known stage (e.g. set, reset, etc.) power-on time (t0) until a predetermined operational voltage supply level having a sufficient level for reliable initialization of sequential elements is reached after a delay time (t1).

In many example applications, during a power supply's ramp-up, an output of the POR circuit (por_out) is kept in a known state (e.g. low). The predetermined supply voltage level during ramp up at which the por_out output signal de-asserts (e.g. goes high) is called a POR de-assertion threshold.

In various example applications, the POR de-assertion happens when the power supply is still ramping up (i.e. at time t1). There may be a lot of variation in the de-assertion threshold voltage (e.g. 0.7V) that can be detrimental in ensuring a reliable startup under varying ramp rate conditions.

For reliable sequential (e.g. logic) element initialization, a known delay (i.e. time t0 to t1), generally longer than a supply voltage ramp-up time specification, is added. Thus, the por_out is de-asserted only after that delay, ensuring that the supply voltage has reached a sufficient level.

In many example applications, this time delay is implemented by switches (e.g. MOSFETS), resistors and capacitors. Such delay circuits can require a significant die or board size.

Figure 2A:
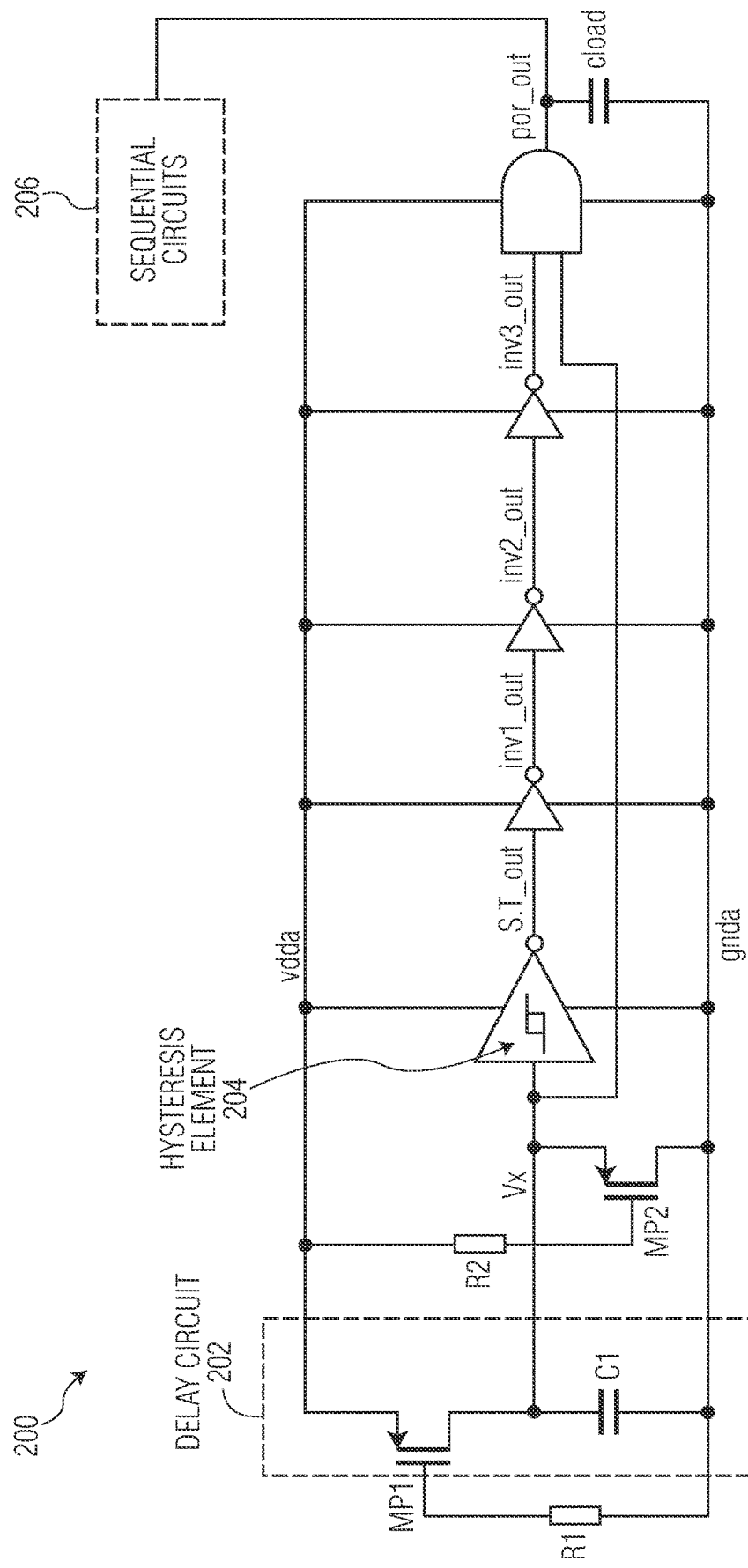
FIG. 2A represents a first example prior art POR circuit.

FIG. 2A represents a first example 200 prior art POR circuit. The first example 200 prior art POR circuit includes a delay circuit 202, a hysteresis device 204, and various other logic and tuning elements. The first example 200 prior art POR circuit is configured to be coupled to a set of sequential circuits 206 (e.g. state devices, latches, controllers, computational circuits, logic devices, etc.). R1 and R2 are in some examples for reducing EMI interference.

The delay circuit 202 includes a switching device (e.g. MP1) and a capacitance device (C1). The delay circuit's 202 POR de-assertion (RC) delay time (t0 to t1) is set by the switching device's (i.e. MP1) on-resistance (R) and the capacitance device's (C1) capacitance. In this example, a gate to source voltage (Vgs) of MP1 is equal to supply voltage (vdda).

Due to this, MP1's on-resistance (R) is reduced and/or very low. If a higher resistance (R) is needed then more MP1 transistors are required (e.g. additional space required) to be added in series and/or a higher capacitance (C1) (e.g. additional space required) is used. Both of these approaches in increasing the RC delay significantly adds to a required die and/or board space required for the first example 200 POR circuit.

The hysteresis device 204 in some examples is a Schmitt trigger circuit.

Figure 2B:
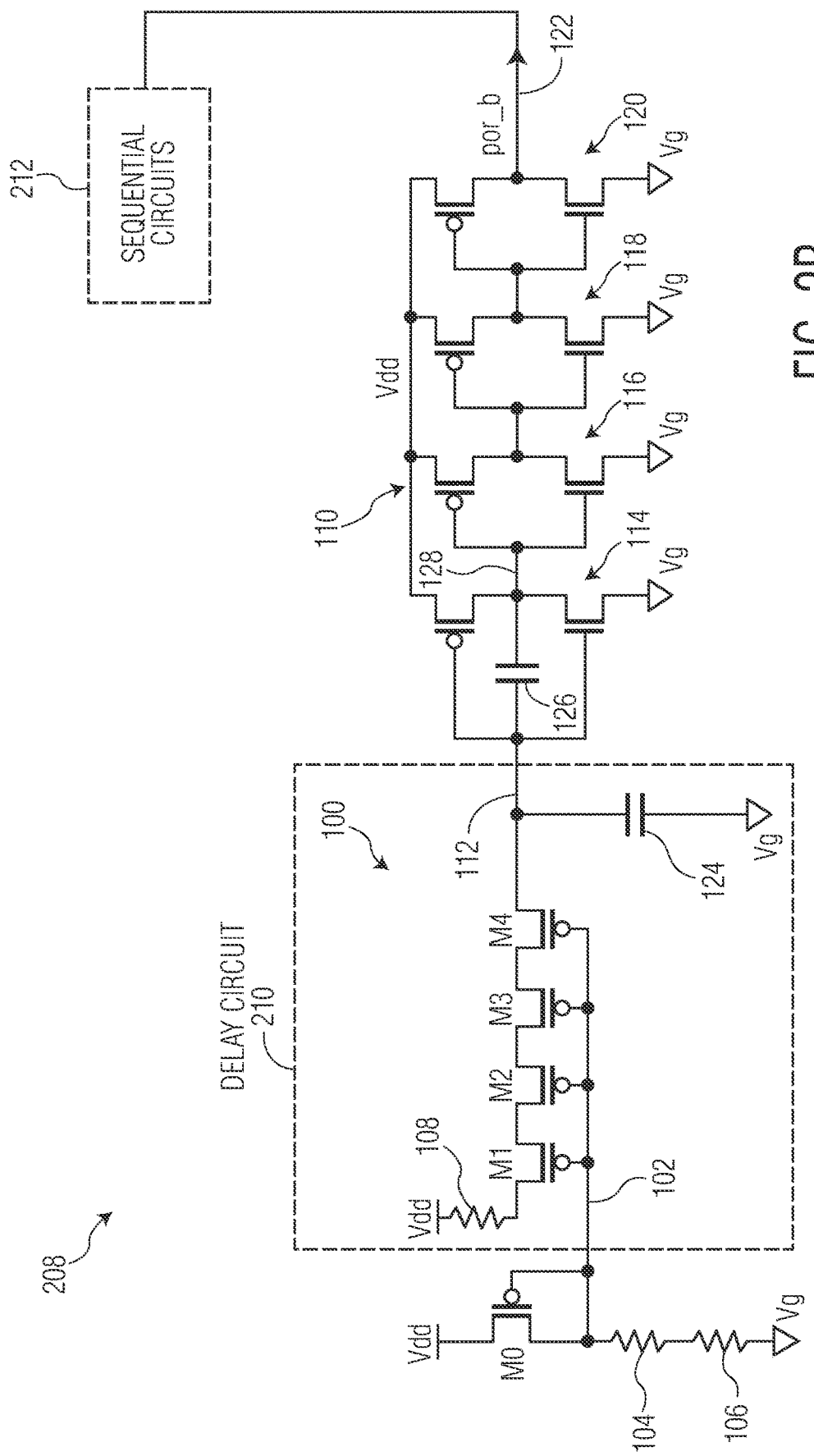
FIG. 2B represents a second example prior art POR circuit.

FIG. 2B represents a second example 208 prior art POR circuit. The second example 208 prior art POR circuit includes a delay circuit 210, and various other logic and tuning elements. The second example 208 prior art POR circuit is configured to be coupled to a set of sequential circuits 212 and/or other controller, computational and/or logic devices.

Here a bias voltage (102) is generated by means of PMOS M0 and resistance 104 and 106. The delay circuit 210 includes a PMOS transistor string composed of M1-M4, which receives its gate voltage from the bias voltage (102).

Since the bias voltage (102) can be generated to be close to the supply voltage (Vdd), an on-resistance (R) of the delay circuit's 210 PMOS resistance string M1-M4 will be quite high. Due to this, the required delay can be obtained in less area.

However, a drawback in this architecture is that the PMOS M0 and resistances 104 and 106 consume a continuous DC current. For low power applications, such a constant drain current may not be suitable. Other similar circuits also consume constant DC currents.

Now discussed are example embodiments of a modified delay-based POR circuit which consume nearly zero current and have lower circuit area requirements. These modified delay-based POR circuits works for wide supply ramp-up rates, supply voltage and temperature ranges. These modified delay-based POR circuits are scalable with a minimal circuit area increase for a large range in RC time constant delays and ramp up rates. The modified delay-based POR circuits technology independent and can be implemented using standard CMOS technology.

In some example embodiments, the modified delay-based POR circuit occupies approx. 67% less area as compared to the prior art delay-based POR circuits for a same delay time and/or de-assertion threshold accuracy. Such modified delay-based POR circuits can consumes nearly zero power, work over a wide supply voltage range (e.g. 2.43V-5.5V) and temperature range (e.g. −40 C to 125 C).

Figure 3:
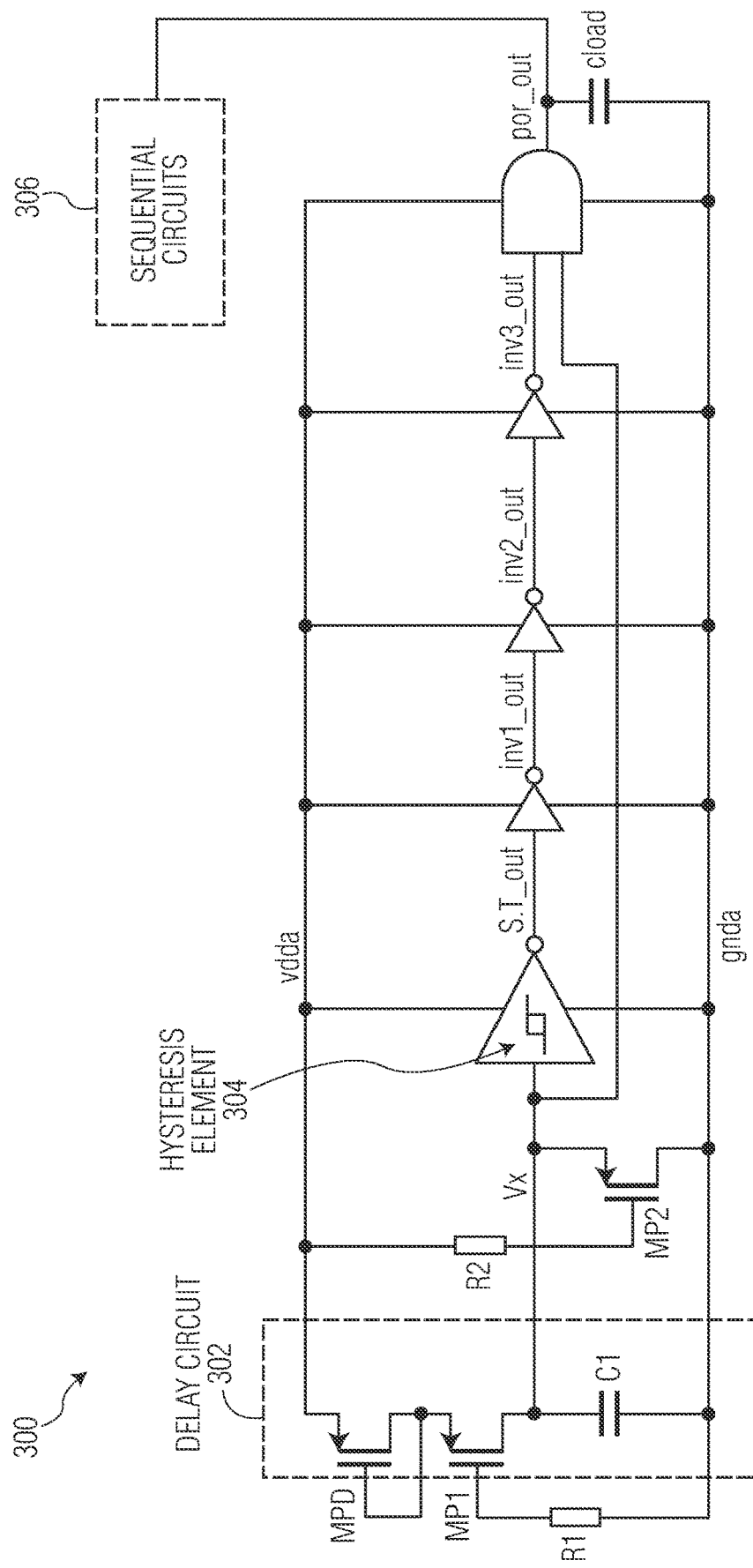
FIG. 3 represents a first example modified POR circuit.

FIG. 3 represents a first example 300 modified POR circuit. The first example 300 modified POR circuit includes a delay circuit 302, a hysteresis device 304, and various other logic and tuning elements. The first example 300 modified POR circuit is configured to be coupled to a set of sequential circuits 306 (e.g. state devices, latches, controllers, computational circuits, logic devices, etc.). R1 and R2 are in some examples for reducing EMI interference.

The delay circuit 302 includes a voltage drop device (e.g. MPD), a switching device (e.g. MOSFET MP1) and a capacitance device (e.g. C1). The hysteresis device 304 in some examples is a Schmitt trigger circuit. The voltage drop device (MPD) is coupled to receive the power supply voltage (vdda). The switching device (MP1) is coupled to the voltage drop device (MPD) and has an on-resistance that varies with a voltage received from the voltage drop device (MPD). The capacitance device (C1) has a capacitance and is coupled between the switching device (MP1) and a ground (gnda).

After power-on, the supply voltage (vdda) increases and a charging current flows first through MPD, second through MP1, and on to charge the capacitance device (C1). Due to the voltage drop caused by the voltage drop device (MPD), the source voltage of the switching device (MP1) is reduced, thereby reducing the switching device's (MP1) effective gate to source voltage (Vgs). The Vgs voltage reduction causes the switching device's (MP1) on-resistance to substantially increase.

In various example embodiments, the voltage drop device (MPD) could be at least one of: a resistance, a diode, a transistor, or a diode connected PMOS device.

The delay circuit's 302 POR de-assertion (RC) delay time (e.g. t0 to t1) is set by the switching device's (i.e. MP1) on-resistance (R) and the capacitance device's (C1) capacitance. Thus by adding the voltage drop device (MPD) in series with the switching device (MP1), only two devices are needed (in some example embodiments) for substantially changing an on-resistance (R) of, and thus a delay time of, the delay circuit 302, substantially reducing a circuit area required for a same delay time result.

The delay circuit 302 outputs a voltage (Vx) to the hysteresis device 304. Prior to the delay time, when the voltage (Vx) is less than a predetermined voltage (e.g. a POR de-assertion threshold voltage), the hysteresis device 304 outputs a first signal (e.g. logic 0) to the sequential circuits 306. After the delay time, when the voltage (Vx) is greater than the predetermined voltage (e.g. the POR de-assertion threshold voltage), the hysteresis device 304 outputs a second signal (e.g. logic 1) to the sequential circuits 306.

In some example embodiments, due to the addition of the voltage drop device (MPD) in series with the switching device (MP1), the delay circuit's 302 output voltage (Vx) does not rise completely to the supply voltage (vdda). This may lead to leakage current flowing in the hysteresis device 304 (e.g. Schmitt Trigger) which may not be desirable. Now discussed is a variation to the first example 300 modified POR circuit to address such concerns.

Figure 4:
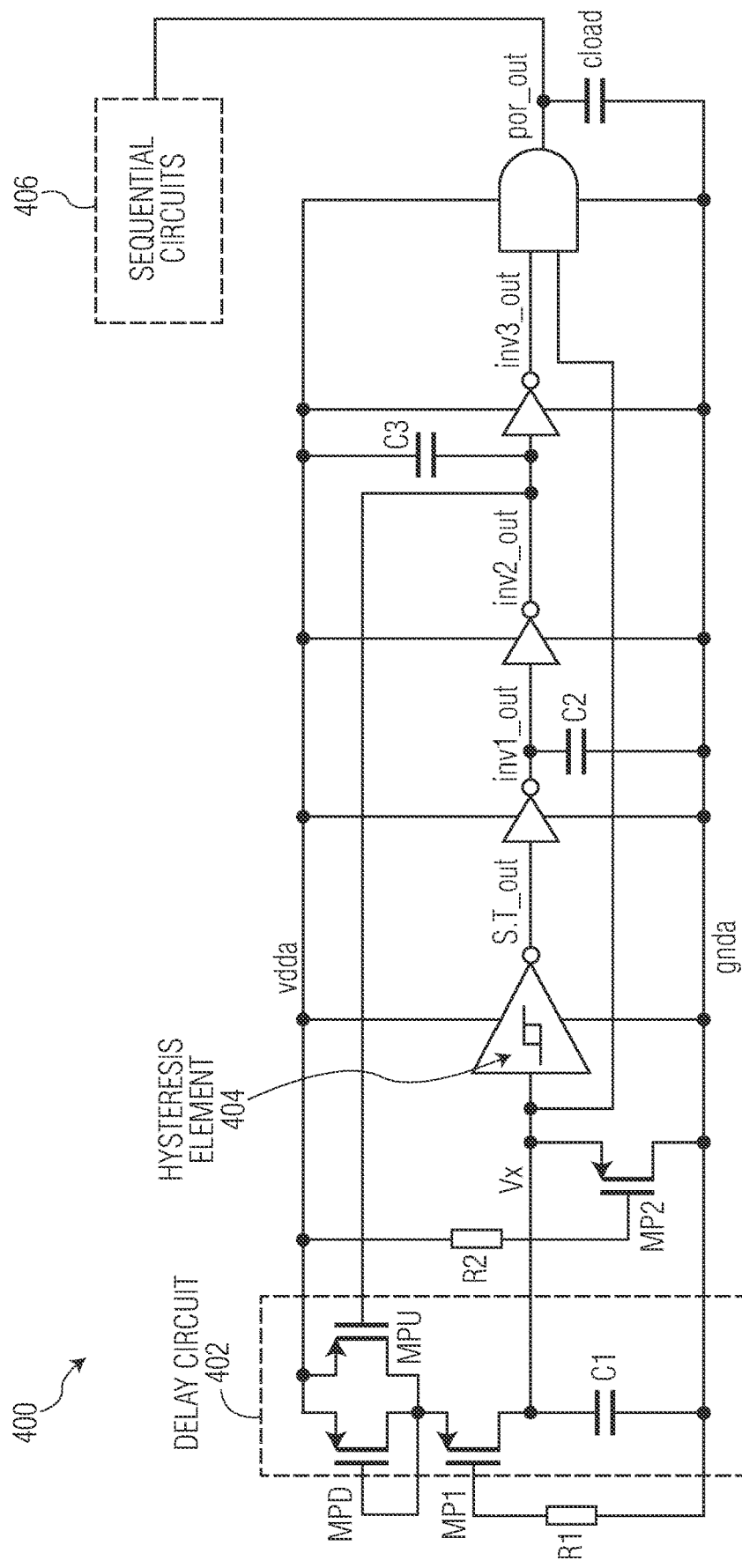
FIG. 4 represents a second example modified POR circuit.

FIG. 4 represents a second example 400 modified POR circuit. The second example 400 modified POR circuit includes a delay circuit 402, a hysteresis device 404, and various other logic and tuning elements. The second example 400 modified POR circuit is configured to be coupled to a set of sequential circuits 406 (e.g. state devices, latches, controllers, computational circuits, logic devices, etc.). R1 and R2 are in some examples for reducing EMI interference.

The delay circuit 402 includes a voltage drop device (e.g. MPD), a switching device (e.g. MOSFET MP1), a capacitance device (e.g. C1), and a weak pull-up transistor (MPU). The pull-up transistor (MPU) helps ensure that the delay circuit's 402 output voltage (Vx) is not lower than the power supply voltage after ramp-up, as explained below.

As the power supply voltage (vdda) ramps up, the delay circuit's 402 output voltage (Vx) increases from a power-off voltage (e.g. 0V). If Vx is lower than the hysteresis device's 404 (e.g. Schmitt Trigger's) threshold voltage, inverter output (inv2_out) follows the power supply voltage (vdda) and the pull-up transistor (MPU) remains OFF.

However, as Vx crosses the hysteresis device's 404 (e.g. Schmitt Trigger's) threshold voltage, output signal (S.T_out) becomes logic low, thereby causing inv2_out to also go low, and thus turning ON the pull-up transistor (MPU) which then pulls Vx towards the power supply voltage (vdda) and reduces/eliminates any leakage current from the hysteresis device 404 (e.g. Schmitt Trigger).

Additional capacitors C2 and C3 (as shown) helps ensure that the gate of the pull-up transistor (MPU) keeps following the power supply voltage during initial ramp up.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A power on reset (POR) circuit, comprising:
   an input configured to receive a power supply voltage;
   an output configured to be coupled to a set of logic circuits;
   a hysteresis device having a first terminal coupled to the output;
   a delay circuit configured to output a first signal to the set of logic circuits prior to a delay time;
   wherein the delay circuit is configured to output a second signal to the set of logic circuits after the delay time;
   wherein the delay circuit includes,
      a capacitance device,
      a voltage drop device having a first terminal coupled to the input and configured to receive the power supply voltage, and
      a MOSFET having a drain terminal configured to be coupled to both a second terminal of the hysteresis device and a first terminal of the capacitance device;
   wherein the MOSFET has an on-resistance and includes a source terminal coupled to a second terminal of the voltage drop device,
   wherein the MOSFET includes a gate coupled to a ground reference; and
   wherein the capacitance device has a capacitance and a second terminal coupled to the ground reference;
   wherein a second terminal of the hysteresis device is coupled to the output; and
   wherein the on-resistance of the MOSFET and the capacitance of the capacitance device together are configured to set the delay time.

2. The POR circuit of claim 1:
   wherein the voltage drop device is configured to reduce a voltage received by the MOSFET.

3. The POR circuit of claim 2:
   wherein the reduced voltage received by the MOSFET causes the on-resistance of the MOSFET to increase.

4. The POR circuit of claim 1:
   wherein the voltage drop device is a resistor.

5. The POR circuit of claim 1:
   wherein the voltage drop device is a diode.

6. The POR circuit of claim 1:
   wherein the voltage drop device is a diode connected PMOS device.

7. The POR circuit of claim 1:
   wherein the delay circuit is configured to output the first signal when the power supply voltage is below a predetermined voltage.

8. The POR circuit of claim 7:
   wherein the delay circuit is configured to output the second signal when the power supply voltage is above the predetermined voltage.

9. The POR circuit of claim 1:
   wherein the predetermined voltage is a POR de-assertion threshold voltage.

10. The POR circuit of claim 1:
    wherein the delay time starts when the POR circuit receives the power supply voltage.

11. The POR circuit of claim 1:
    wherein the input of the hysteresis device is configured to receive a ramping voltage from the delay circuit.

12. The POR circuit of claim 11:
    wherein the hysteresis device is configured to transmit the first signal on the output when the ramping voltage is below the predetermined voltage; and wherein the hysteresis device is configured to transmit the second signal on the output when the ramping voltage is above the predetermined voltage.

13. The POR circuit of claim 1:
wherein the hysteresis device is a Schmitt trigger circuit.

14. The POR circuit of claim 1:
wherein the MOSFET is a first MOSFET;
further comprising a pull-up second MOSFET having,
  a source terminal coupled to the input and configured to receive the power supply voltage,
  a drain terminal coupled to the source terminal of the first MOSFET, and
  a gate terminal coupled to the second terminal of the hysteresis device.

15. The POR circuit of claim 1:
wherein the set of logic circuits include at least one of: a state device, a latch, a set-reset, a flip-flop, a controller, a computational circuit, or another logic device.

16. The POR circuit of claim 1:
wherein the POR circuit consumes nearly zero current.

17. The POR circuit of claim 1:
wherein the MOSFET is a first MOSFET;
wherein the voltage drop device is a second MOSFET having,
  a source terminal coupled to the input and configured to receive the power supply voltage,
  a drain terminal coupled to the source terminal of the first MOSFET, and
  a gate terminal coupled to the source terminal of the first MOSFET.

18. The POR circuit of claim 17:
wherein the gate terminal of the second MOSFET is coupled to the drain terminal of the second MOSFET in a diode connected configuration.

\* \* \* \* \*